US012587151B2

(12) United States Patent
Lehtola

(10) Patent No.: US 12,587,151 B2
(45) Date of Patent: Mar. 24, 2026

(54) WIDE BANDWIDTH PHASE COMPENSATION FOR POWER AMPLIFIER

(71) Applicant: SKYWORKS SOLUTIONS, INC., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 269 days.

(21) Appl. No.: 18/141,913

(22) Filed: May 1, 2023

(65) Prior Publication Data
US 2024/0171139 A1 May 23, 2024

Related U.S. Application Data

(60) Provisional application No. 63/337,161, filed on May 1, 2022.

(51) Int. Cl.
*H03F 3/24* (2006.01)
*H04B 1/04* (2006.01)

(52) U.S. Cl.
CPC ....... *H03F 3/245* (2013.01); *H03F 2200/451* (2013.01); *H04B 2001/045* (2013.01); *H04B 1/0475* (2013.01)

(58) Field of Classification Search
CPC ........ H03F 3/245; H03F 3/211; H03F 1/3276; H03F 1/0288; H03F 2200/451; H04B 1/0475; H04B 1/0458; H04B 2001/045
See application file for complete search history.

(56) References Cited

U.S. PATENT DOCUMENTS

| | | | | |
|---|---|---|---|---|
| 6,889,034 B1* | 5/2005 | Dent | ......................... | H01Q 5/50 |
| | | | | 455/121 |
| 7,385,447 B1* | 6/2008 | Adar | ......................... | H03F 3/19 |
| | | | | 330/149 |
| 2006/0220744 A1* | 10/2006 | Wong | ...................... | H03F 3/604 |
| | | | | 330/295 |
| 2011/0098011 A1* | 4/2011 | Camp, Jr. | ............. | H03F 1/3247 |
| | | | | 330/149 |
| 2016/0065141 A1* | 3/2016 | Yoshikawa | ............. | H03F 3/602 |
| | | | | 330/295 |
| 2016/0181987 A1* | 6/2016 | Perreault | ................... | H03F 3/21 |
| 2016/0211810 A1* | 7/2016 | Kerek | ..................... | H03F 3/211 |

FOREIGN PATENT DOCUMENTS

| | | | | |
|---|---|---|---|---|
| EP | 3672068 A1 * | 6/2020 | ........... | H03F 1/0288 |

* cited by examiner

*Primary Examiner* — Lester G Kincaid
(74) *Attorney, Agent, or Firm* — Chang & Hale LLP

(57) ABSTRACT

In some embodiments, an amplifier circuit can include an input node and an output node, and an amplifier implemented between the input node and the output node. The amplifier circuit can further include a phase compensation circuit implemented between the input node and an input of the amplifier. The phase compensation circuit can be configured to provide a phase shift that depends on a control voltage. In some embodiments, the amplifier circuit can be implemented as a power amplifier circuit.

11 Claims, 12 Drawing Sheets

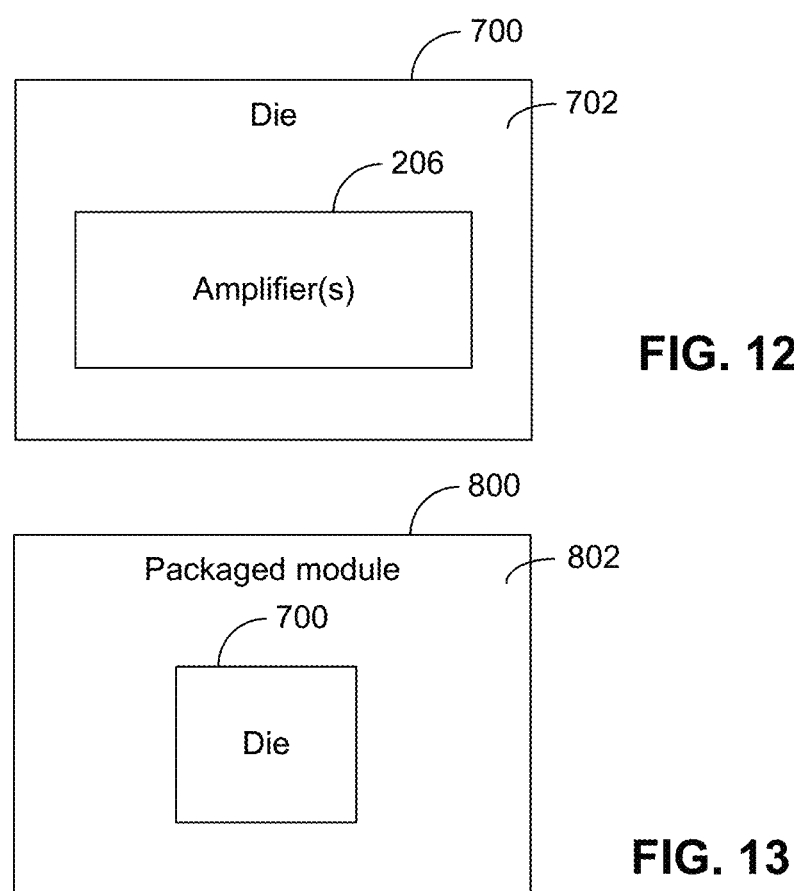
FIG. 12
FIG. 13
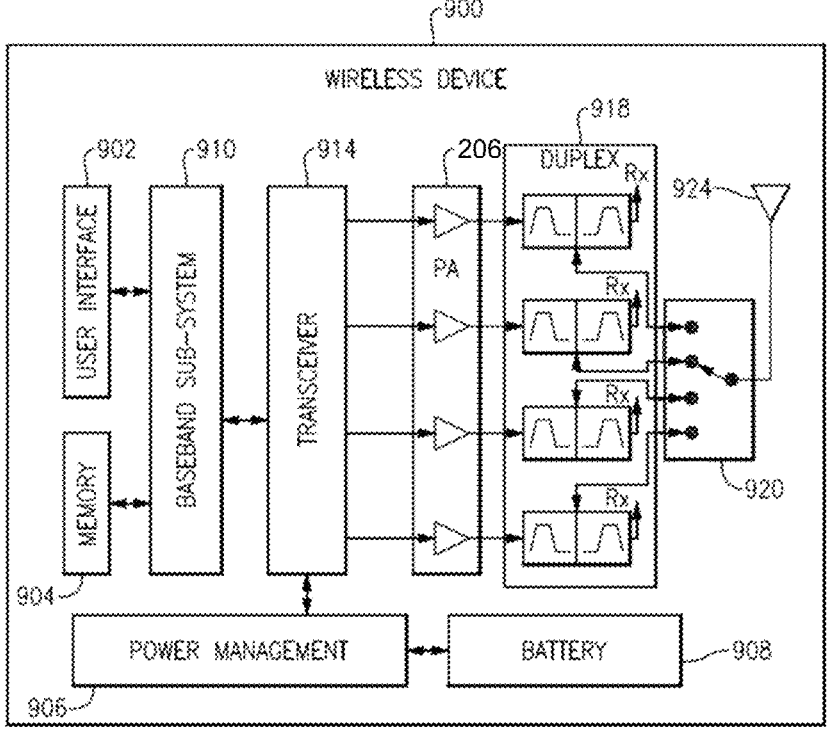
FIG. 14

WIDE BANDWIDTH PHASE COMPENSATION FOR POWER AMPLIFIER

CROSS-REFERENCE TO RELATED APPLICATION(S)

This application claims priority to U.S. Provisional Application No. 63/337,161 filed May 1, 2022, entitled WIDE BANDWIDTH PHASE COMPENSATION FOR POWER AMPLIFIER, the disclosure of which is hereby expressly incorporated by reference herein in its entirety.

BACKGROUND

Field

The present disclosure relates to amplifiers for radio-frequency (RF) applications.

Description of the Related Art

In electronic applications such as radio-frequency (RF) applications, signals can be amplified for a number of reasons. For example, an RF signal to be transmitted can be amplified by a power amplifier, and such an amplified signal can be routed to an antenna for transmission.

SUMMARY

In accordance with a number of implementations, the present disclosure relates to a power amplifier circuit that includes an input node and an output node, and a power amplifier implemented between the input node and the output node. The power amplifier circuit further includes a phase compensation circuit implemented between the input node and an input of the power amplifier. The phase compensation circuit is configured to provide a phase shift that depends on a control voltage.

In some embodiments, the phase compensation circuit can include a ladder of PI transmission line sections, with each section including a shunt capacitance, a series inductance and a shunt capacitance. Each shunt capacitance is implemented to provide variable capacitance based on the control voltage. In some embodiments, each shunt capacitance of the respective section can include an anti-parallel arrangement of two diodes. The control voltage can be provided to a node between the anti-parallel arranged diodes.

In some embodiments, the phase compensation circuit can include a plurality of cascading transmission line sections with respective shunt paths having reverse biased diodes. Each of the cascading transmission line sections can include first and second inductances arranged in series, with the respective shunt path being provided from a node between the first and second inductances and ground. The control voltage can be provided to the node between the first and second inductances of each transmission line section.

In some embodiments, the phase compensation circuit can include a plurality of cascading transmission line sections with each of respective shunt paths having an anti-parallel arrangement of two diodes. Each of the cascading transmission line sections can include first and second inductances arranged in series, with the respective shunt path being provided from a node between the first and second inductances and ground. The control voltage can be provided to a node between the anti-parallel arranged diodes of each transmission line section.

In some embodiments, the power amplifier can include an input stage and an output stage. The input stage can be implemented as a driver stage, and the output stage can be implemented as a final stage.

In some embodiments, the driver stage can be implemented as a cascode driver stage. The cascode driver stage can be configured to operate with a Class AB bias.

In some embodiments, the final stage can be implemented as a push-pull amplifier. The push-pull amplifier can include a splitter having an input and a pair of outputs, with each output being coupled to an input of a respective amplifier, and the push-pull amplifier further including a combining circuit that combines outputs of the pair of amplifiers. Each of the pair of amplifiers can be configured to operate with a Class AB bias. The combining circuit can include a transformer circuit having a primary with first and second nodes coupled to the outputs of the pair of amplifiers, and a secondary with first and second nodes, with the first node being coupled to an output node.

In some embodiments, the power amplifier circuit can further include a load modulation circuit coupled to the output node and configured to provide variable capacitance that depends on a control voltage.

In some implementations, the present disclosure relates to a method for amplifying a radio-frequency signal. The method includes receiving a signal at an input node, and providing a phase shift for the signal with a phase shifting circuit implemented between the input node and an input of a power amplifier. The phase shifting circuit is configured to provide the phase shift that depends on a control voltage. The method further includes amplifying the phase shifted signal with a power amplifier implemented between the phase shifting circuit and an output node.

In some implementations, the present disclosure relates to a semiconductor die that includes a substrate and a power amplifier circuit implemented on the substrate. The power amplifier circuit includes an input node and an output node, and a power amplifier implemented between the input node and the output node. The power amplifier circuit further includes a phase compensation circuit implemented between the input node and an input of the power amplifier. The phase compensation circuit is configured to provide a phase shift that depends on a control voltage.

In some embodiments, the substrate can be configured to support heterojunction bipolar transistors.

In some implementations, the present disclosure relates to a packaged module that includes a packaging substrate and a power amplifier circuit implemented on the packaging substrate. The power amplifier circuit includes an input node and an output node, and a power amplifier implemented between the input node and the output node. The power amplifier circuit further includes a phase compensation circuit implemented between the input node and an input of the power amplifier. The phase compensation circuit is configured to provide a phase shift that depends on a control voltage.

In some embodiments, the power amplifier circuit can be implemented on a single semiconductor die.

In some embodiments, the packaged module can be implemented as a power amplifier module.

In some implementations, the present disclosure relates to a wireless device that includes an antenna and an amplifier circuit configured to amplify a radio-frequency signal associated with the antenna. The amplifier circuit includes an amplifier and a phase compensation circuit implemented on an input side of the amplifier. The phase compensation circuit is configured to provide a phase shift that depends on a control voltage.

In some embodiments, the amplifier circuit can be implemented as a power amplifier circuit. The antenna can be configured to support a transmit operation of the amplified radio-frequency signal provided by the power amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 12 shows that in some embodiments, a semiconductor die can include a power amplifier circuit having a phase compensation circuit as described herein.

FIG. 13 shows that in some embodiments, one or more features as described herein can be implemented in a packaged module.

FIG. 14 depicts an example wireless device having one or more advantageous features described herein.

DETAILED DESCRIPTION OF SOME EMBODIMENTS

The headings provided herein, if any, are for convenience only and do not necessarily affect the scope or meaning of the claimed invention.

A power amplifier (PA) typically has some degree of phase distortion (AMPM) that degrades linearity performance. Conventional solutions for such phase distortion issues can include, for example, improving a power amplifier's inherent AMPM characteristic, or relying on predistortion applied to a power amplification system.

Described herein are examples related to a phase compensation circuit that can provide improved bandwidth over conventional solutions, and also provide an additional functionality of allowing optimization or improvement of AMPM and linearity in a corresponding power amplification system.

Figure 1:
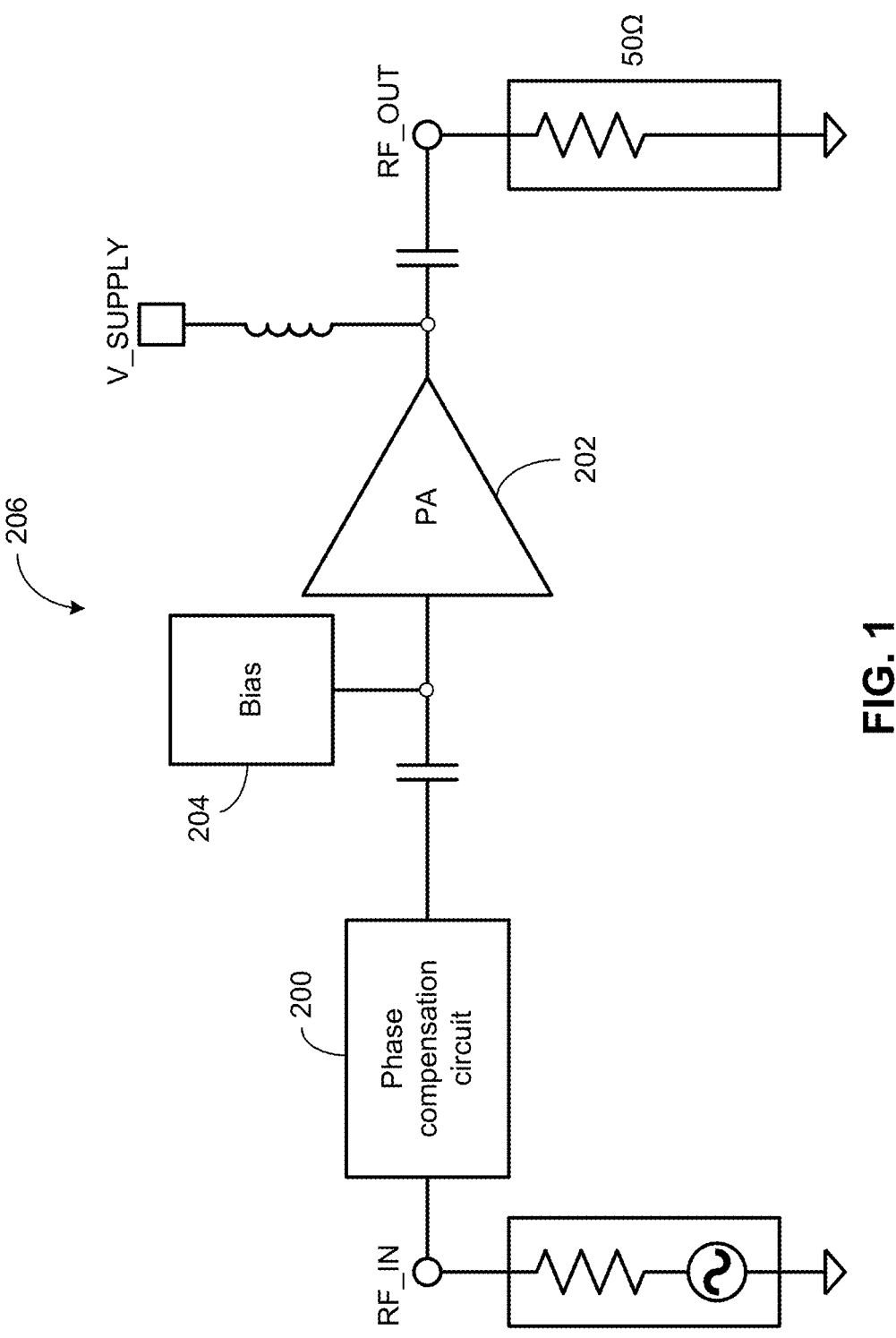
FIG. 1 shows that in some embodiments, a power amplifier circuit can include a phase compensation circuit implemented on an input side of a power amplifier.

FIG. 1 shows a power amplifier circuit 206 configured to receive a signal as an input (RF_IN) and amplify the signal with a power amplifier 202. The amplified signal can then be provided as an output (RF_OUT). The power amplifier 202 can be provided with one or more bias signals from a bias circuit 204, and one or more supply signals (V_SUPPLY).

FIG. 1 shows that in some embodiments, the power amplifier circuit 206 can include a phase compensation circuit 200 implemented on the input side of the power amplifier 202. For example, the phase compensation circuit 200 is shown to be implemented between the input RF_IN and a DC-blocking capacitance on the input side of the power amplifier 202.

Although various examples are described herein in the context of power amplifiers, it will be understood that in some embodiments, one or more features of the present disclosure can also be utilized for other types of amplifiers.

Figure 2:
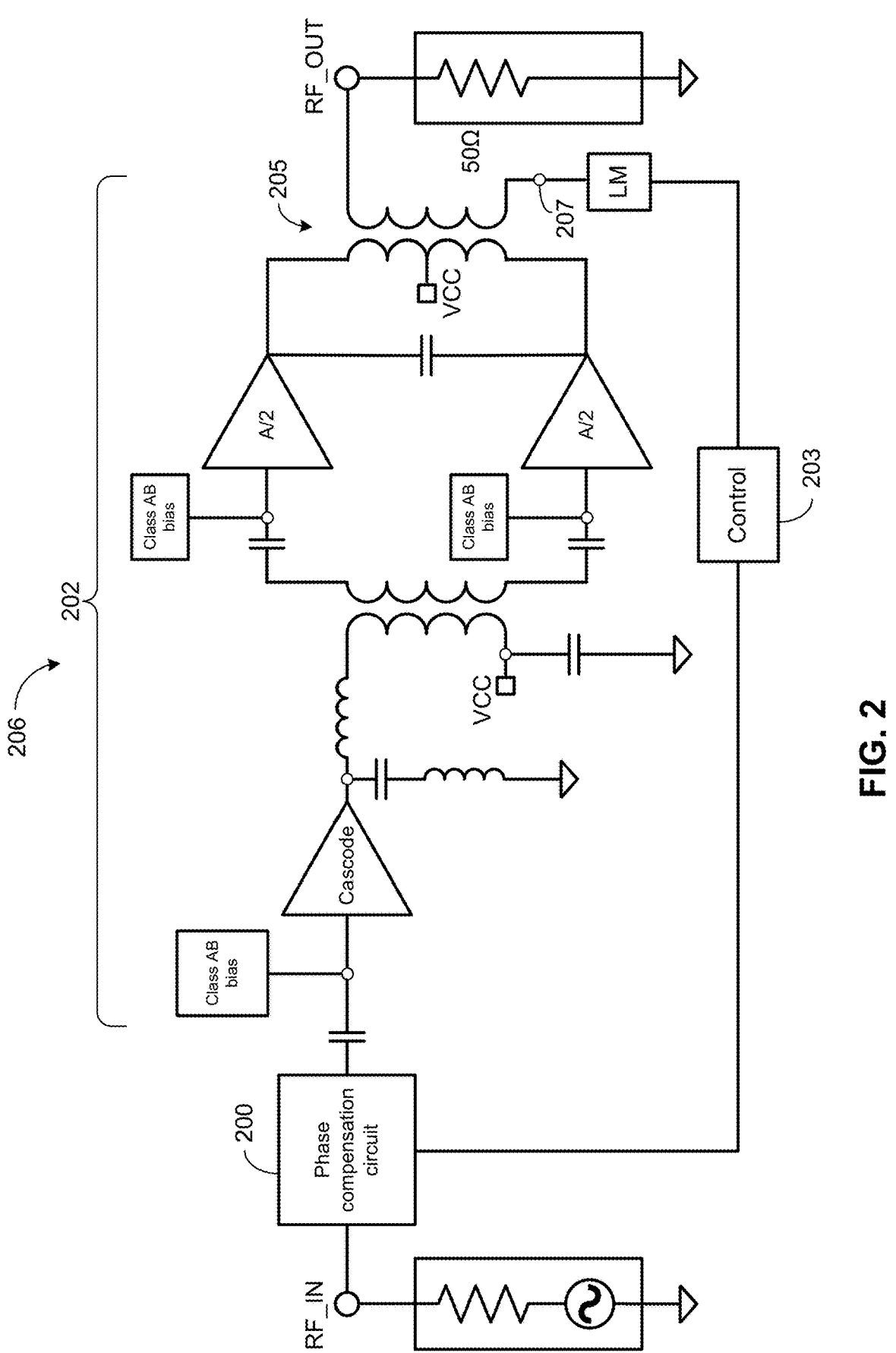
FIG. 2 shows that in some embodiments, the power amplifier of FIG. 1 can be implemented as a power amplifier having a push-pull architecture.

FIG. 2 shows that in some embodiments, the power amplifier 202 of FIG. 1 can be implemented as a power amplifier having a push-pull architecture. In the example of FIG. 2, the power amplifier 202 is shown to include a cascode driver stage and an inverse F push-pull final stage. In some embodiments, a load modulator (LM) may or may not be present. If present, such a load modulator can be coupled to a combiner 205 that combines the outputs of two amplifiers (each indicated as A/2 in FIG. 2) of the push-pull final stage.

In the example of FIG. 2, each of the cascode driver stage and the push-pull final stage is depicted as being provided with Class AB bias. However, it will be understood that one or more features of the present disclosure can also be implemented in power amplifiers having different bias configurations.

FIG. 2 shows that in some embodiments, a phase compensation circuit 200 having one or more features as described herein can be implemented on the input side of the cascode driver stage, and be controlled by a control circuit 203. In some embodiments, the control circuit 203 can also be coupled to a node 207 on the output side of the combiner 205. In some embodiments, if a load modulator (LM) is present, such a load modulator can be implemented between the control circuit 203 and the node 207 and also be controlled by the control circuit 203.

Figure 3:
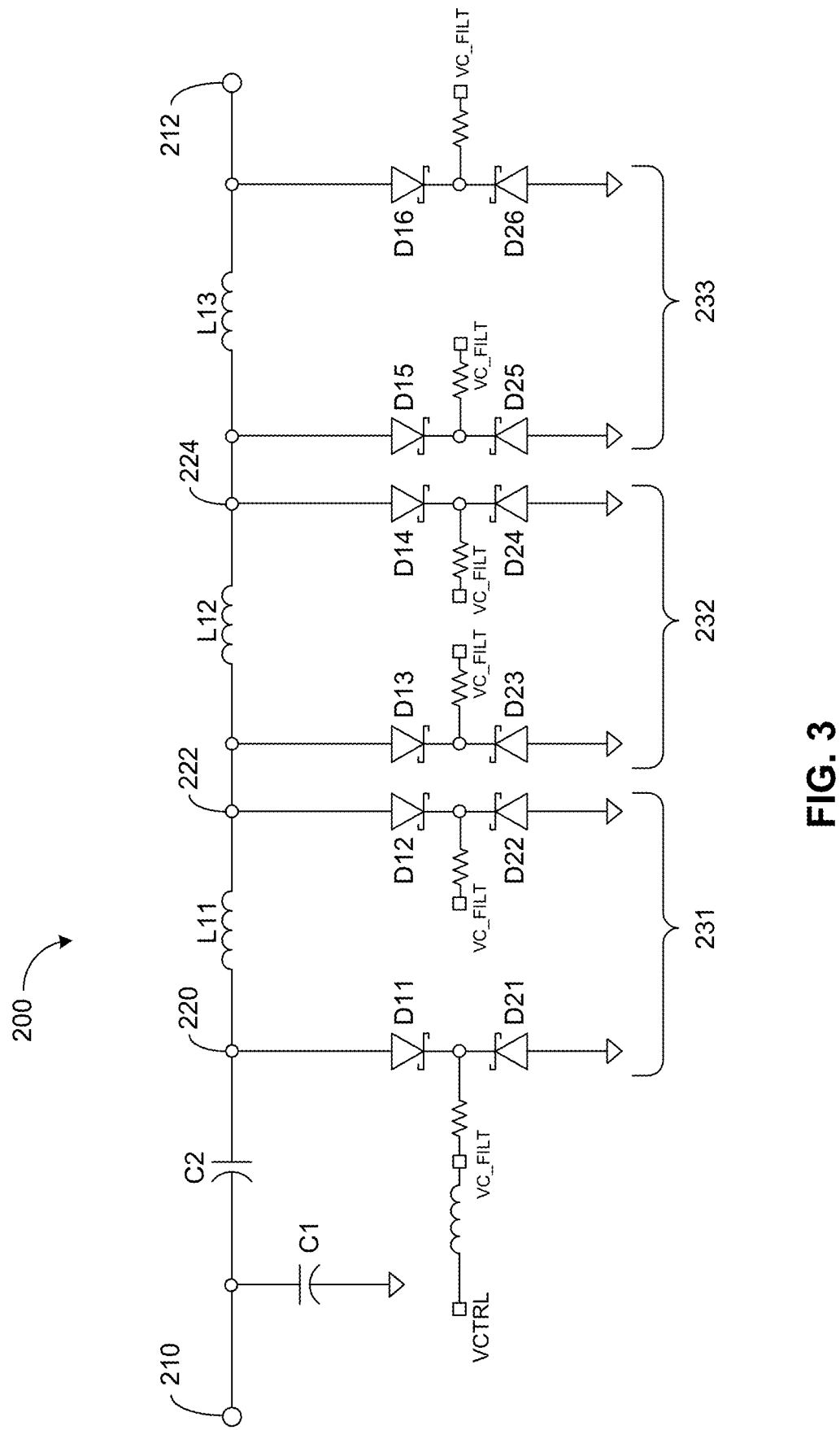
FIG. 3 shows that in some embodiments, the phase compensation circuit of FIGS. 1 and 2 can be implemented as a ladder of PI transmission line sections.

FIG. 3 shows that in some embodiments, the phase compensation circuit 200 of FIGS. 1 and 2 can be implemented as a ladder of PI transmission line sections, with each section including a shunt capacitance, a series inductance and a shunt capacitance, with each shunt capacitance being implemented to provide variable capacitance. In the example of FIG. 3, the phase compensation circuit 200 is shown to include three sections 231, 232, 233; however, it will be understood that a phase compensation circuit having one or more features as described herein can include different numbers of sections.

In the example of FIG. 3, the phase compensation circuit 200 is shown to be provided between first and second nodes 210, 212. In the context of the power amplifier circuits 206 of FIGS. 1 and 2, the first node 210 can be the same as, or be coupled to, the input node (RF_IN), and the second node 212 can be the same as, or be coupled to the input side of the input DC block capacitance.

Referring to FIG. 3, a shunt capacitance C1 can be provided between the first node 210 and ground, and a series capacitance C2 can be provided between the first node 210 and the first section 231.

FIG. 3 shows that in some embodiments, each of the two variable capacitances that form the two shunt capacitances of each section can be implemented using a reverse biased diode in an anti-parallel configuration as a varactor. Such a varactor can be controlled with control voltage VCTRL.

More particularly, the first section 231 is shown to include first and second shunt varactors implemented on respective ends of a series inductance L11, with the first varactor including an anti-parallel arrangement of diodes D11, D21, and the second varactor including an anti-parallel arrangement of diodes D12, D22. The control voltage VCTRL is shown to be provided to each of the first and second varactors from a node VC_FILT through a resistance.

Similarly, the second section 232 is shown to include first and second shunt varactors implemented on respective ends of a series inductance L12, with the first varactor including an anti-parallel arrangement of diodes D13, D23, and the second varactor including an anti-parallel arrangement of diodes D14, D24. The control voltage VCTRL is shown to be provided to each of the first and second varactors from a node VC_FILT through a resistance.

Similarly, the third section 233 is shown to include first and second shunt varactors implemented on respective ends of a series inductance L13, with the first varactor including an anti-parallel arrangement of diodes D15, D25, and the second varactor including an anti-parallel arrangement of diodes D16, D26. The control voltage VCTRL is shown to be provided to each of the first and second varactors from a node VC_FILT through a resistance.

In the example of FIG. 3, the VC_FILT nodes of the three sections 231, 232, 233 can be the same node. Such a common node can be coupled to a voltage node (indicated as VCTRL) through an inductance to filter out AC components.

Configured in the foregoing manner, the phase compensation circuit 200 can provide a functionality where the RF phase shift from input to output is a function of the control voltage. Further the diode configuration in the phase compensation circuit has a very low capacitive load and allows phase shifting to be controlled in a dynamic manner.

Figure 4:
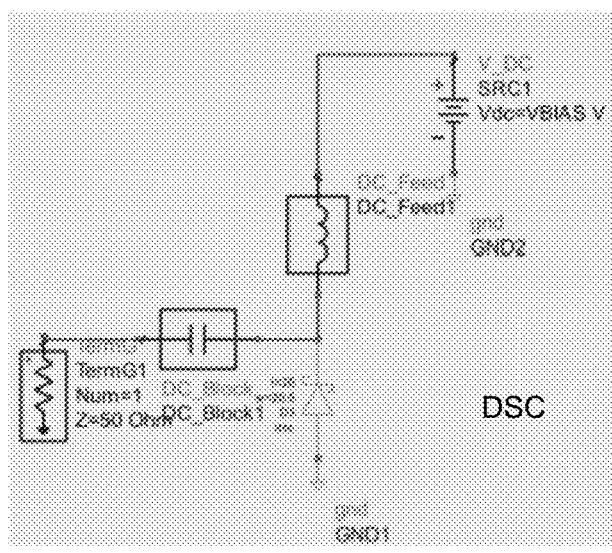
FIG. 4 shows examples of diodes that can be utilized for the diodes in the phase compensation circuit of FIG. 3.
Figure 4:
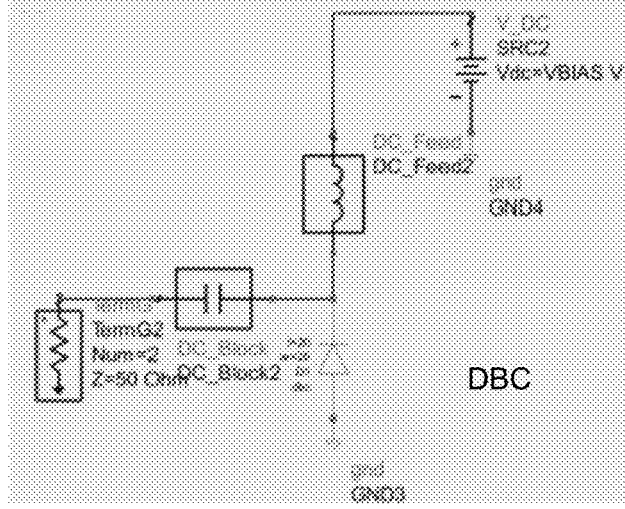
Figure 4:
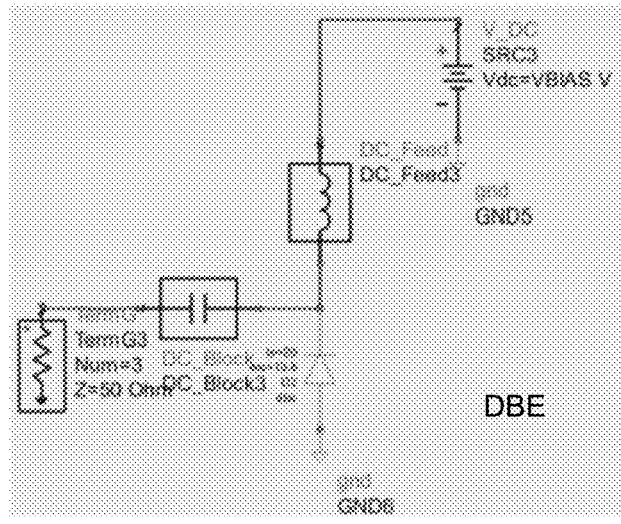

FIG. 4 shows examples of diodes that can be utilized for the diodes in the phase compensation circuit 200 of FIG. 3. For example, in some embodiments, DSC (substrate-collector junction diode), DBC (base-collector junction diode), or DBE (base-emitter junction diode) can be utilized for each diode in the phase compensation circuit 200 of FIG. 3.

In the examples of FIG. 4, it is noted that the DSC diode configuration can provide the widest tuning range among the three example diodes. Thus, in the example phase compensation circuit 200 of FIG. 3, such DSC diodes are utilized for each of the diodes D11 to D16 and D21 to D26.

Figure 5:
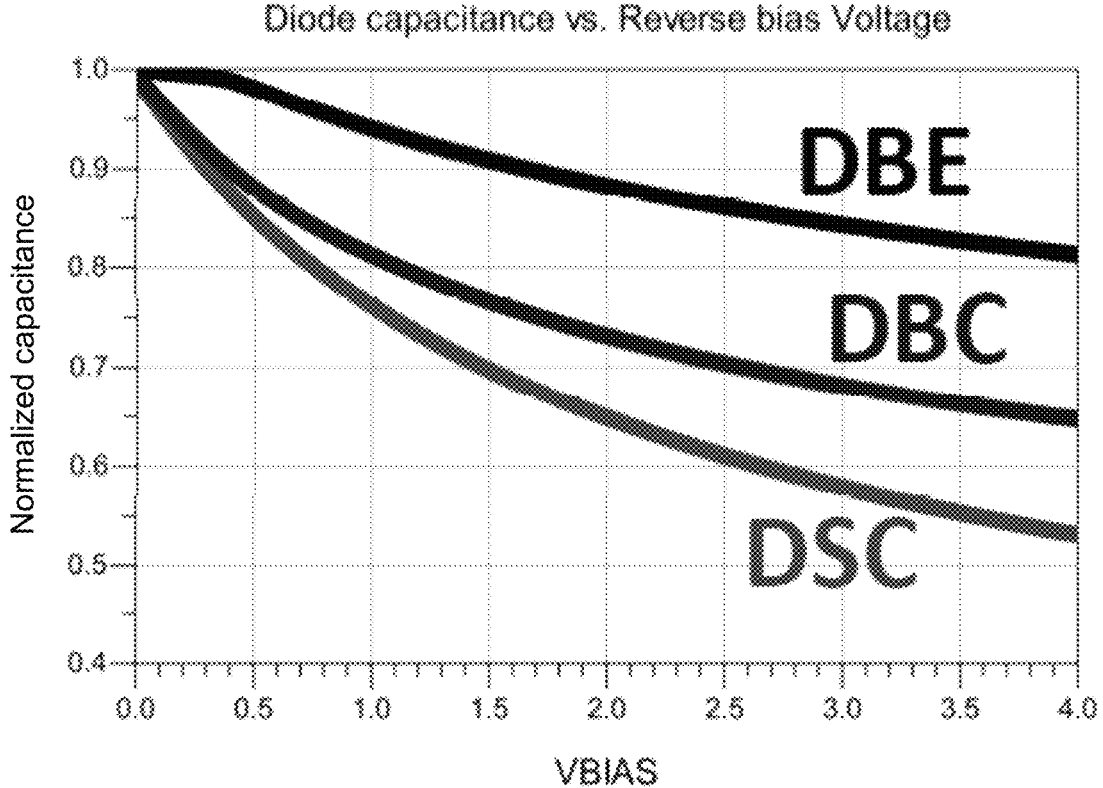
FIG. 5 shows plots of diode capacitance as a function of reverse bias voltage for the three example diode configurations of FIG. 4.

FIG. 5 shows plots of diode capacitance as a function of reverse bias voltage (VBIAS) for the three example diode configurations of FIG. 4. In the example of FIG. 5, the capacitance is normalized so that diode area is scaled for 1 pF zero bias capacitance.

As seen in FIG. 5, the DSC diode configuration provides the largest tuning range of capacitance among the three diode configurations. For example, in a reverse bias voltage range from 0V to 3V, the DSC diode configuration provides over 40% tuning range, whereas the DBC diode configuration provides about 30% tuning range, and the DBE diode configuration provides less than 20% tuning range.

Figure 6:
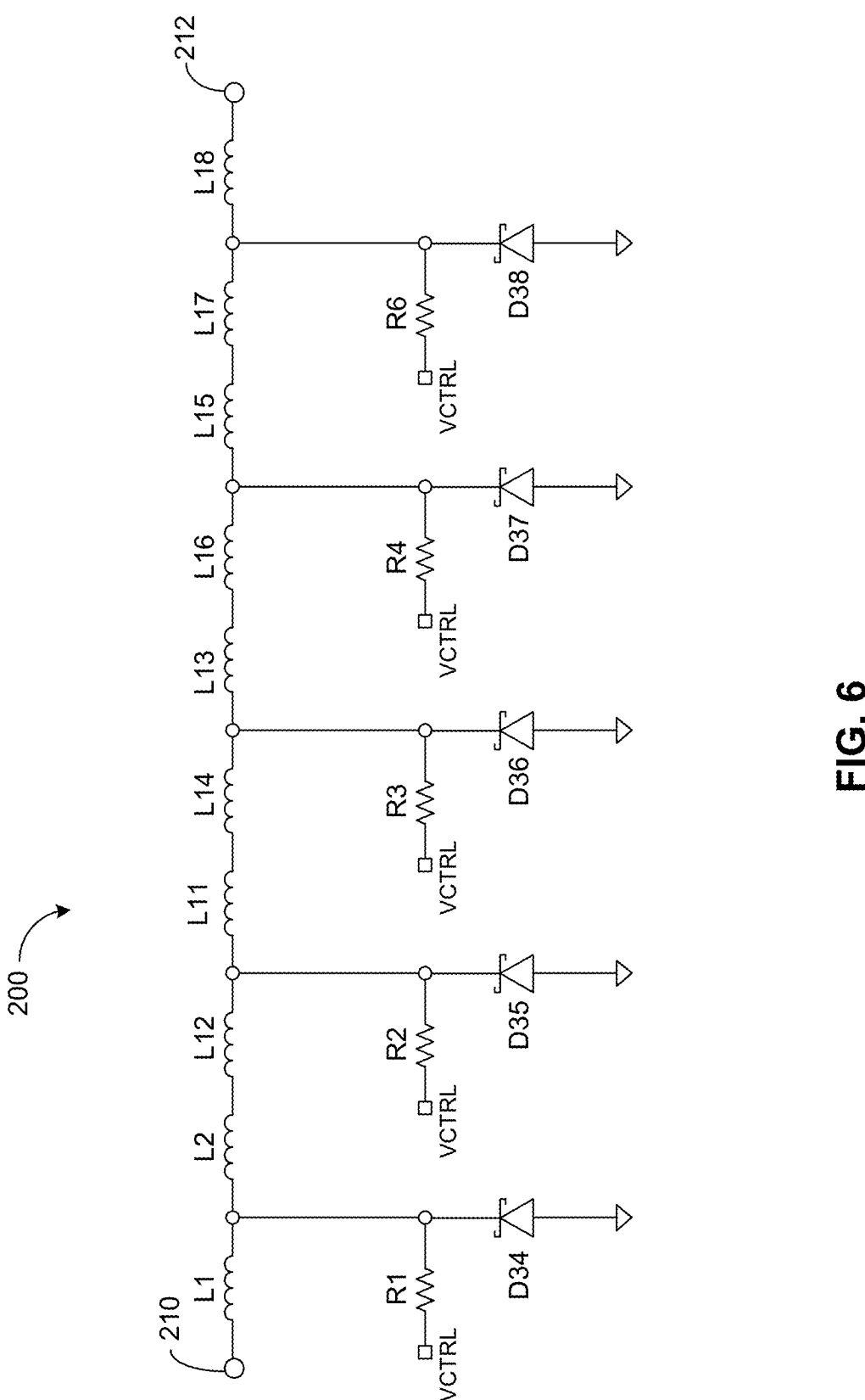
FIG. 6 shows another example of a phase shifter configuration that could be implemented for the phase compensation circuit of FIGS. 1 and 2.

FIG. 6 shows another example of a phase shifter configuration 200 that could be implemented for the phase compensation circuit 200 of FIGS. 1 and 2. In the example of FIG. 6, the phase shifter is implemented as cascading transmission lines with reverse biased diodes. For example, the phase compensation circuit 200 is shown to be provided between first and second nodes 210, 212. In the context of the power amplifier circuits 206 of FIGS. 1 and 2, the first node 210 can be the same as, or be coupled to, the input node (RF_IN), and the second node 212 can be the same as, or be coupled to the input side of the input DC block capacitance.

Referring to FIG. 6, inductances L1, L2, L12, L11, L14, L13, L16, L15, L17 and L18 are shown to be arranged in series between the first and second nodes 210, 212. A first shunt path is shown to be provided from a node between L1 and L2 to ground through a diode D34; a second shunt path is shown to be provided from a node between L12 and L11 to ground through a diode D35; a third shunt path is shown to be provided from a node between L14 and L13 to ground through a diode D36; a fourth shunt path is shown to be provided from a node between L16 and L15 to ground through a diode D37; and a fifth shunt path is shown to be provided from a node between L17 and L18 to ground through a diode D38.

Referring to FIG. 6, a control voltage VCTRL is shown to be provided to the node between L1 and L2 through a resistance R1, the node between L12 and L11 through a resistance R2, the node between L14 and L13 through a resistance R3, the node between L16 and L15 through a resistance R4, and the node between L17 and L18 through a resistance R6.

Referring to the configuration of FIG. 6, DC blocking capacitances can be provided on the input and out sides. However, such DC blocks can lower the control signal's RC corner.

Figure 7:
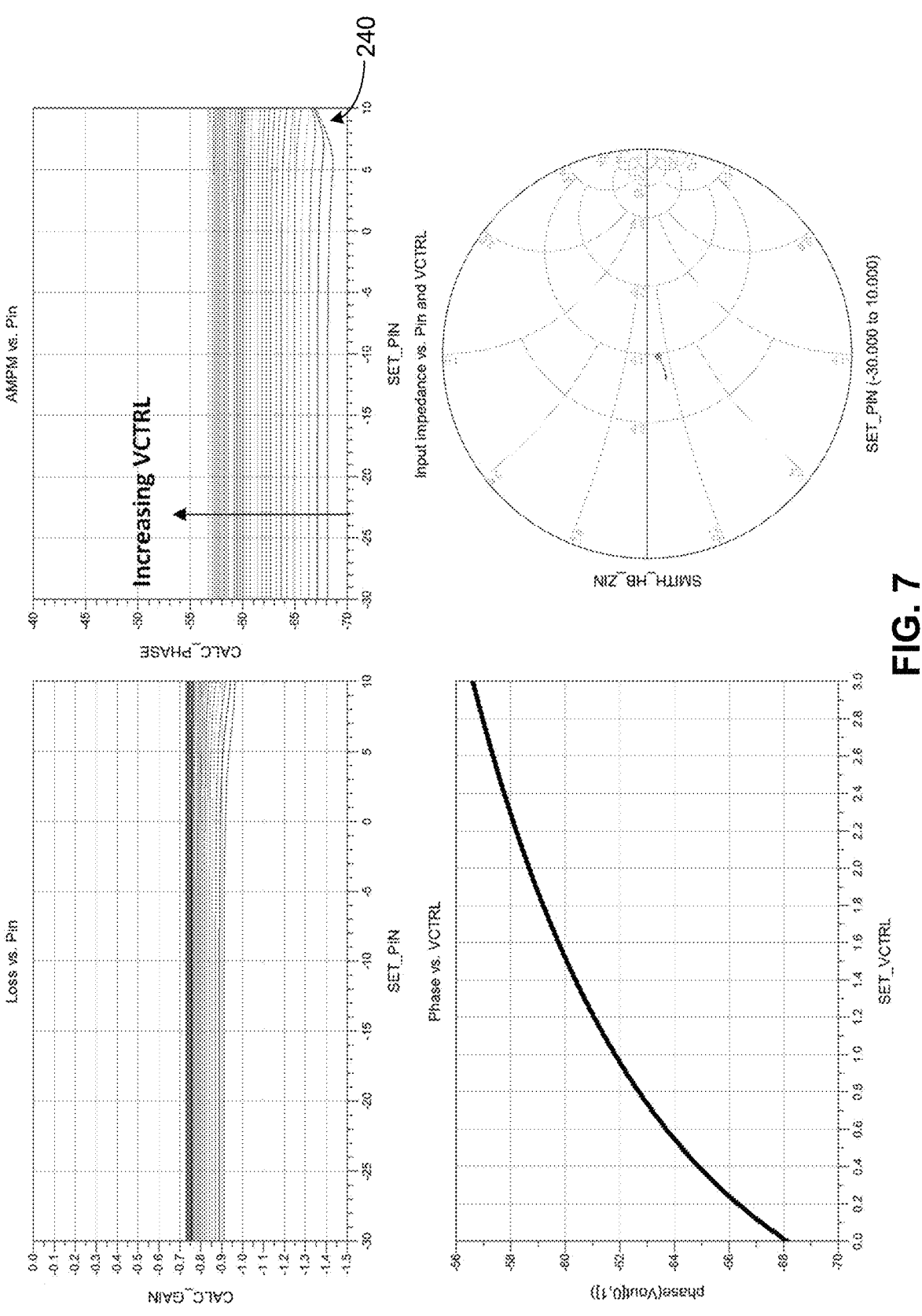
FIG. 7 shows AMAM, AMPM and phase shift vs control voltage for the phase shifter of FIG. 6.

FIG. 7 shows loss vs input power plots (upper left), AMPM vs input power plots (upper right) and phase shift vs control voltage VCTRL plots (lower left) for the phase shifter of FIG. 6. As shown in the region indicated as 240, AMPM variation can occur at higher power.

Figure 8:
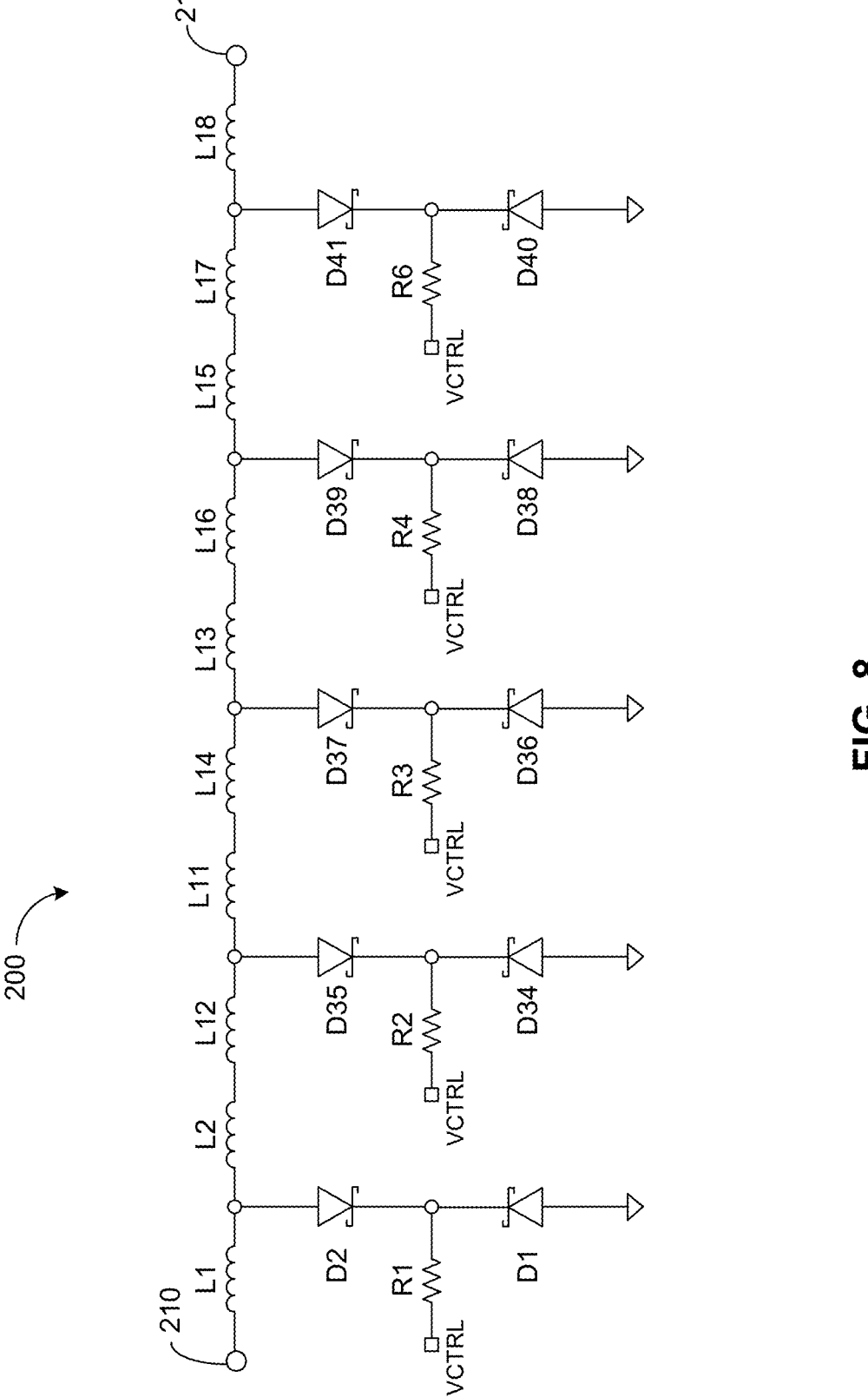
FIG. 8 shows another example of a phase shifter configuration that could be implemented for the phase compensation circuit of FIGS. 1 and 2.

FIG. 8 shows another example of a phase shifter configuration 200 that could be implemented for the phase compensation circuit 200 of FIGS. 1 and 2. In FIG. 8, the phase compensation circuit 200 is shown to be provided between first and second nodes 210, 212. In the context of the power amplifier circuits 206 of FIGS. 1 and 2, the first node 210 can be the same as, or be coupled to, the input node (RF_IN), and the second node 212 can be the same as, or be coupled to the input side of the input DC block capacitance.

Referring to FIG. 8, inductances L1, L2, L12, L11, L14, L13, L16, L15, L17 and L18 are shown to be arranged in series between the first and second nodes 210, 212. A first shunt path is shown to be provided from a node between L1 and L2 to ground through an anti-parallel arrangement of diodes D1, D2; a second shunt path is shown to be provided from a node between L12 and L12 to ground through an anti-parallel arrangement of diodes D34, D35; a third shunt path is shown to be provided from a node between L14 and L13 to ground through an anti-parallel arrangement of diodes D36, D37; a fourth shunt path is shown to be provided from a node between L16 and L15 to ground through an anti-parallel arrangement of diodes D38, D39; and a fifth shunt path is shown to be provided from a node between L17 and L18 to ground through an anti-parallel arrangement of diodes D40, D41.

Referring to FIG. 8, a control voltage VCTRL is shown to be provided to a node between the anti-parallel arranged diodes D1, D2 through a resistance R1, a node between the anti-parallel arranged diodes D34, D35 through a resistance R2, a node between the anti-parallel arranged diodes D36, D37 through a resistance R3, a node between the anti-parallel arranged diodes D38, D39 through a resistance R4, and a node between the anti-parallel arranged diodes D40, D1 through a resistance R6.

In the example of FIG. 8, the phase shifter 200 can provide more linear response utilizing stacked diodes. More particularly, each diode can have two diodes arranged in an anti-parallel manner and provide similar capacitance as in a single diode configuration. Accordingly, same phase shift can be provided per section. In such a configuration, input and/or output nodes can be provided with a DC short to ground, and provide a wider bandwidth control.

Figure 9:
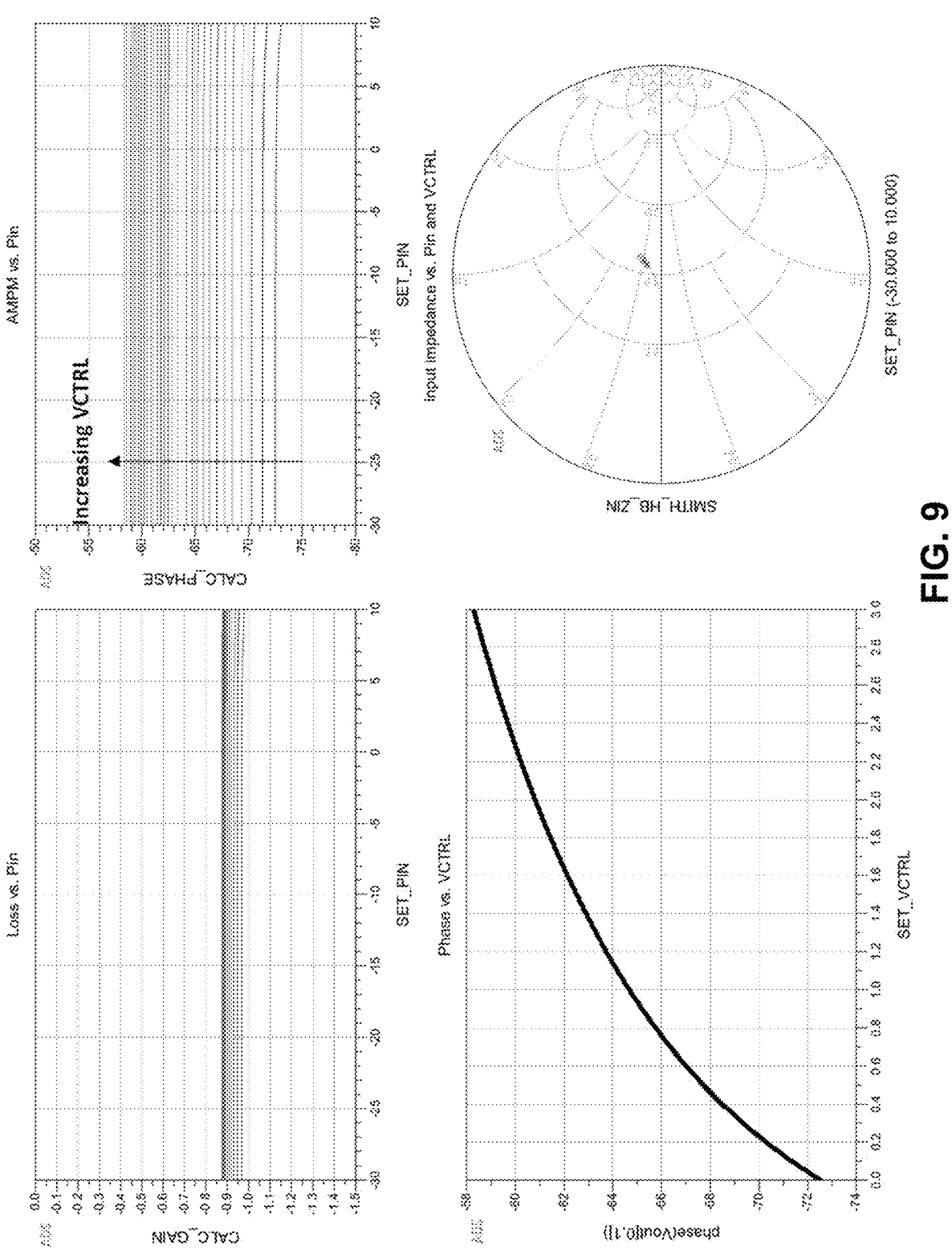
FIG. 9 shows AMAM, AMPM and phase shift vs control voltage for the phase shifter of FIG. 8.

FIG. 9 shows loss vs input power plots (upper left), AMPM vs input power plots (upper right) and phase shift vs control voltage VCTRL plots (lower left) for the phase shifter 200 of FIG. 8. Compared to the example phase shifter of FIGS. 6 and 7, the phase shifter of FIGS. 8 and 9 has less AMPM variation at higher output power.

Figure 10:
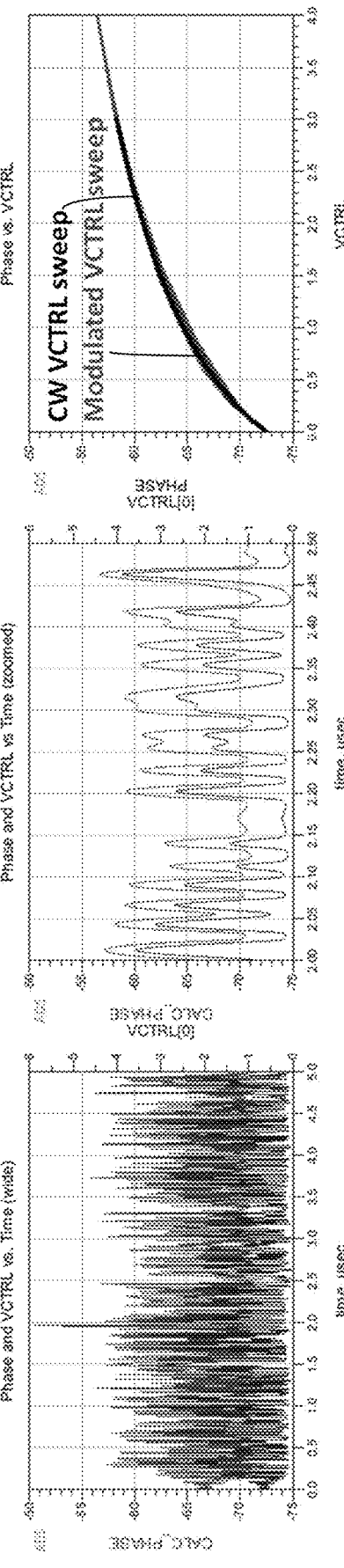
FIG. 10 shows various plots for the phase shifter of FIG. 8 when operated in a dynamic manner with an example envelope applied to a control signal.

FIG. 10 shows various plots for the phase shifter 200 of FIG. 8 when operated in a dynamic manner with an example 100 MHz MPR3 envelope applied to a control signal. One can see that there is close agreement between static and modulated characteristics in phase vs VCTRL.

Figure 11:
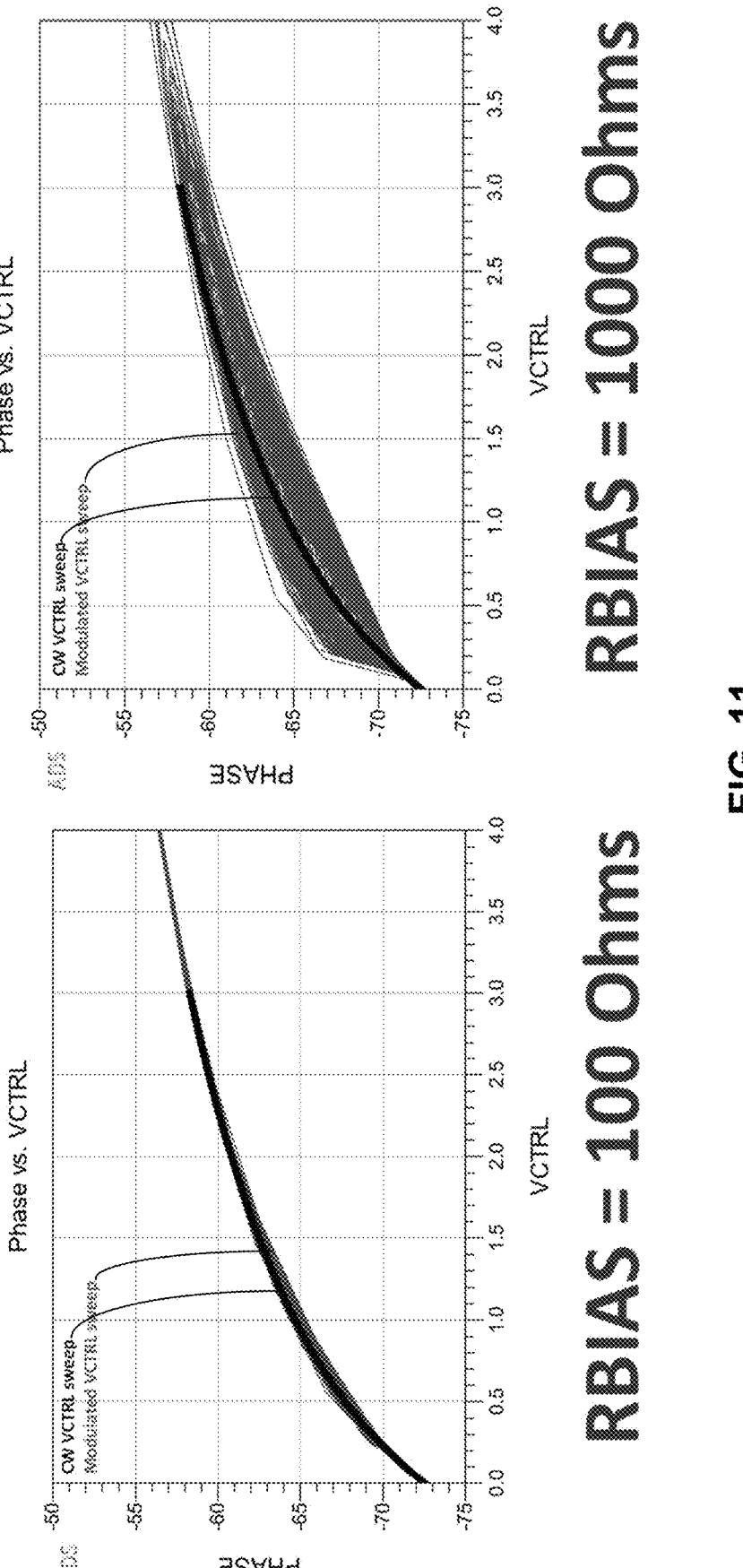
FIG. 11 shows another example set of plots for the phase shifter of FIG. 8 when operated in a dynamic manner.

FIG. 11 shows another example set of plots for the phase shifter 200 of FIG. 8 when operated in a dynamic manner. The left panel corresponds to phase vs VCTRL when the bias resistance is 100 Ohms, and the right panel corresponds to phase vs VCTRL when the bias resistance is 1,000 Ohms. For each panel, the static (CW VCTRL sweep) and dynamic (Modulated VCTRL sweep) portions are indicated. One can see that for a wider bandwidth modulation, it is desirable to provide a bias feed resistance that is lower (e.g., 100 Ohms instead of 1,000 Ohms).

FIG. 12 shows that in some embodiments, a semiconductor die 700 can include a power amplifier circuit 206 having a phase compensation circuit as described herein. Such a power amplifier circuit can be implemented on a semiconductor substrate 702.

FIG. 13 shows that in some embodiments, one or more features as described herein can be implemented in a packaged module 800. Such a packaged module can include a packaging substrate 802 configured to receive a plurality of components. At least some of the components mounted on the packaging substrate 802 can include a die such as the die 700 of FIG. 12.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 14 depicts an example wireless device 900 having one or more advantageous features described herein. In some embodiments, one or more power amplifier circuits 206 can include a phase compensation feature as described herein. In some embodiments, such one or more power amplifier circuits can be implemented on a power amplifier module.

In the example wireless device 900, the power amplifier (PA) circuits 206 having a plurality of PAs can provide one or more amplified RF signals to the switch 920 (via an assembly of one or more duplexers 918), and the switch 920 can route the amplified RF signal(s) to one or more antennas. In some embodiments, the PAs in the circuits 206 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 14, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A power amplifier circuit comprising:
an input node and an output node;
a power amplifier implemented between the input node and the output node; and
a phase compensation circuit implemented between the input node and an input of the power amplifier and configured to provide a phase shift that depends on a control voltage, the phase compensation circuit including a ladder of PI transmission line sections, each section including a shunt capacitance, a series inductance and a shunt capacitance, each shunt capacitance including an anti-parallel arrangement of two diodes to provide variable capacitance based on the control voltage provided to a node between the anti-parallel arranged diodes.

2. The power amplifier circuit of claim 1 wherein the power amplifier includes an input stage and an output stage.

3. The power amplifier of claim 2 wherein the input stage is implemented as a driver stage, and the output stage is implemented as a final stage.

4. The power amplifier circuit of claim 3 wherein the driver stage is implemented as a cascode driver stage.

5. The power amplifier of claim 4 wherein the cascode driver stage is configured to operate with a Class AB bias.

6. The power amplifier circuit of claim 3 wherein the final stage is implemented as a push-pull amplifier.

7. The power amplifier of claim 6 wherein the push-pull amplifier includes a splitter having an input and a pair of outputs, each output coupled to an input of a respective amplifier, the push-pull amplifier further including a combining circuit that combines outputs of the pair of amplifiers.

8. The power amplifier of claim 7 wherein the combining circuit includes a transformer circuit having a primary with first and second nodes coupled to the outputs of the pair of amplifiers, and a secondary with first and second nodes, the first node coupled to an output node.

9. The power amplifier circuit of claim 1 further comprising a load modulation circuit coupled to the output node and configured to provide variable capacitance that depends on a control voltage.

10. A power amplifier circuit comprising:
an input node and an output node;
a power amplifier implemented between the input node and the output node; and
a phase compensation circuit implemented between the input node and an input of the power amplifier and configured to provide a phase shift that depends on a control voltage, the phase compensation circuit including a plurality of cascading transmission line sections with respective shunt paths having reverse biased diodes, each transmission line section including first and second inductances arranged in series, with the respective shunt path being provided from a node between the first and second inductances to ground, such that the control voltage is provided to the node between the first and second inductances of each transmission line section.

11. A power amplifier circuit comprising:
an input node and an output node;
a power amplifier implemented between the input node and the output node; and
a phase compensation circuit implemented between the input node and an input of the power amplifier and configured to provide a phase shift that depends on a control voltage, the phase compensation circuit including a plurality of cascading transmission line sections with each of respective shunt paths having an anti-parallel arrangement of two diodes each transmission line section including first and second inductances arranged in series, with the respective shunt path being provided from a node between the first and second inductances to ground, such that the control voltage is provided to a node between the anti-parallel arranged diodes of each transmission line section.

* * * * *